United States Patent [19]

Chu et al.

[11] Patent Number: 5,773,319
[45] Date of Patent: Jun. 30, 1998

[54] METHOD FOR PRODUCING A HYDROGENATED VERTICAL-CAVITY SURFACE-EMITTING LASER

[75] Inventors: Hye-Yong Chu; Byueng-Su Yoo; Hyo-Hoon Park, all of Daejeon, Rep. of Korea

[73] Assignee: Electronics and Telecommunications Research Institute, Daejeon, Rep. of Korea

[21] Appl. No.: 842,960

[22] Filed: Apr. 25, 1997

[30] Foreign Application Priority Data

Dec. 5, 1996 [KP] DPR of Korea ................ 1996-62146

[51] Int. Cl.[6] .............................. H01L 21/20; H01S 3/19
[52] U.S. Cl. ............................. 438/39; 438/29; 438/38; 438/46; 372/44
[58] Field of Search ................................ 438/32, 39, 41, 438/22, 29, 38, 46; 372/43, 44, 45, 46, 48; 430/312

[56] References Cited

U.S. PATENT DOCUMENTS 5,115,442  5/1992  Lee et al. .................................. 372/45
5,416,044  5/1995  Chino et al. ............................. 437/129

OTHER PUBLICATIONS

Vakhshoori, D., et al. *Top–surface emitting lases with 1.9V threshold voltage and the effect of spatial hole burning on their transverse mode operation and efficiencies,* Appl. Phys. Lett. vol. 62 (13), Mar. 29, 1993, pp. 1448–1450.

Yoo, B.-S., et al. *Stable transverse mode emission in vertical–cavity surface–emitting lasers antiguided by amorphous GaAs layer,* Electronics Letters, vol. 32, No. 2, Jan. 18, 1996, pp. 116–117.

Yang, G.M., et al. *Ultralow threshold VCSELs fabricated by selective oxidation from all epitaxial structure,* Department of Electrical Engineering/Electrophysics, University of Southern California, pp. 2–3.

*Primary Examiner*—Charles L. Bowers, Jr.
*Assistant Examiner*—Keith Christianson
*Attorney, Agent, or Firm*—Cohen, Pontani, Lieberman, Pavane

[57] ABSTRACT

A method for producing a vertical-cavity surface-emitting laser, includes the steps of: forming a bottom mirror layer, an active layer and a top mirror layer on a semiconductor substrate; forming an antireflection layer on a rear surface of the semiconductor substrate; selectively etching peripheral portions of the antireflection layer to form a first electrode; defining laser emission portions through etching processing; forming a hydrogenated barrier over an entire surface of the resultant structure; forming a post; forming a passivation layer through the hydrogenating of the exposed top mirror layer and the portions of the active layer; forming a planarization film after the partial exposure of the top mirror and forming a second electrode pad to which the exposed top mirror layer contacts.

7 Claims, 4 Drawing Sheets

METHOD FOR PRODUCING A HYDROGENATED VERTICAL-CAVITY SURFACE-EMITTING LASER

BACKGROUND OF THE INVENTION

1. Field of the Invention

The present invention relates to a method for fabricating a vertical-cavity surface-emitting laser and, more particularly to a method for producing a vertical-cavity surface-emitting laser comprising hydrogenating of some portions of a top mirror layer and active layer in an atmosphere of hydrogen plasma.

2. Description of the Conventional Art

Vertical-cavity surface-emitting lasers have been intensively investigated because of their advantages of an effective coupling to optical fiber for applications in optical computing and fiber communications, as well as an easy fabrication of a two-dimensional laser array.

A number of different approaches have been used in isolating the vertical-cavity surface-emitting laser devices from each other.

For an isolation, a cavity is subjected to an etching process, an active layer is subjected to impurity implantation, or wet oxidation may be used.

The approach employing an ion-beam etching process for the cavity results in lattice damage at the surface of the cavity, which increases in the leakage current. The device for a single mode emission requires a decrease in size thereof below 10 micrometer, which exhibits a significant increase in the leakage current at the device surface, thereby resulting in higher threshold currents and lower output power characteristics.

The approach employing impurity implantation results in lattice damage at the active region, which acts as a cause of the recombination and thus increases in the threshold current. Furthermore, because impurity implantation is carried out from the device surface, it has difficulty in fabricating the device having smaller current implantation range below about 5 micrometer.

The approach employing the wet oxidation, which is to electrically isolate the devices through an oxidation to make an oxidized Al layer, is widely used so as to obtain lower threshold current characteristics. However, the low refractive index of Al oxide causes the lasers to be operated as a refractive-induced type device, so the required single mode emission feature cannot thus be readily obtained.

SUMMARY OF THE INVENTION

Accordingly, it is an object of the present invention to provide a method for fabricating a vertical-cavity surface-emitting laser having characteristics of low threshold current and a single mode emission which can be achieved by effectively isolating devices through hydrogenation in an atmosphere of hydrogen plasma.

To achieve the above objects, there is provided a method for producing a vertical-cavity surface-emitting laser comprising the steps of: sequentially forming a bottom mirror layer, an active layer and a top mirror layer on a compound semiconductor substrate; forming an antireflection layer on a rear surface of the compound semiconductor substrate; selectively etching predetermined peripheral portions of the antireflection layer, and then forming a first electrode; forming a first photoresist pattern on a surface of the top mirror layer to define laser emission portions, and removing the first photoresist pattern after selectively etching portions of the top mirror layer by using the first photoresist pattern as a mask; forming a protection layer for hydrogenation barrier over an entire surface of the resultant structure; forming a second photoresist pattern on a surface of the protection layer for hydrogenation of a post, and removing the second photoresist pattern after selectively etching the protection layer for hydrogenation, the top mirror layer and portions of the active layer by using the second photoresist pattern as a mask; forming a passivation layer through the hydrogenation of the exposed top mirror layer and the portions of the active layer; exposing the top mirror layer by etching the protection layer over the surface of the post; forming a planarization film over an entire surface of the resultant structure, and exposing the top mirror layer on the post; and forming a second electrode pad to which the exposed top mirror layer contacts.

BRIEF DESCRIPTION OF THE DRAWINGS

The present invention will become more fully understood to following detailed description taken in conjunction with the accompanying drawings, wherein.

DETAILED DESCRIPTION OF THE INVENTION

The preferred embodiment according to the present invention will now be described in detail in accordance with the accompanying drawings.

Figure 1:
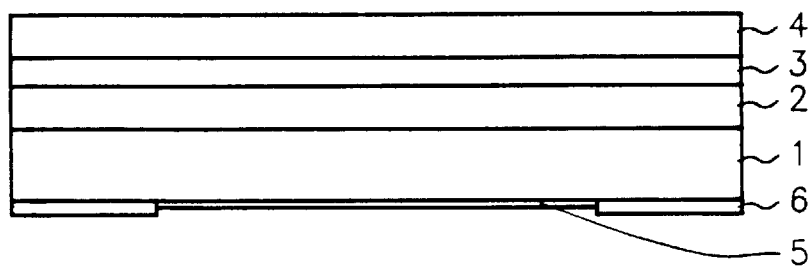
FIGS. 1 through 8 are cross-sectional views illustrating a method for producing a vertical-cavity surface-emitting laser according to the present invention.

As shown in FIG. 1, on a GaAs-based compound semiconductor substrate 1 a bottom mirror 2, an active layer 3 and a top mirror 4 are sequentially formed, and then on a rear surface of the semiconductor substrate 1 are formed multi-layered thin films of SiOx/TiOx as an antireflection layer 5 while satisfying antireflection requirements. Then, the selective etching of peripheral portions of the antireflection layer 5 leaves an n-type electrode 6.

Figure 2:
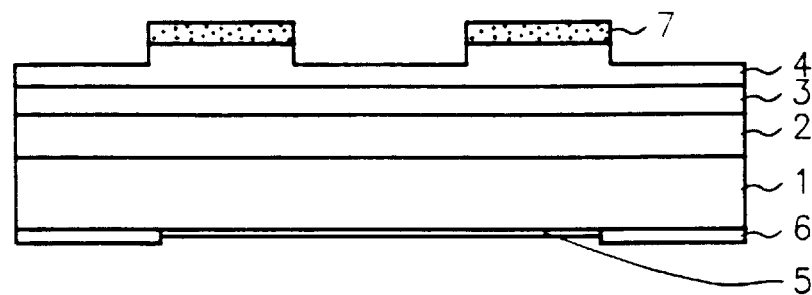

As shown in FIG. 2, on an overall surface of the resultant structure is coated with a photoresist and then patterned so as to result in the photoresist pattern 7. Using this pattern 7 as an etch barrier against an ion beam etching, some portions of a top mirror layer 4 are etched to form a post.

Figure 3:
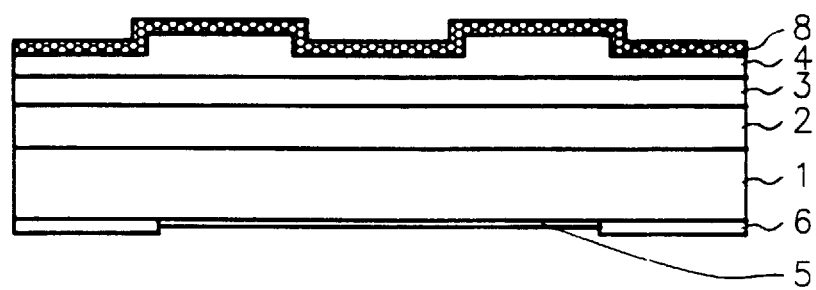

Next, as shown in FIG. 3, after removal of the photoresist film 7, a protection layer 8 for hydrogenation of SiNx or SiOx having a thickness of about 300 nm is deposited using a chemical vapor deposition or a plasma enhanced chemical vapor deposition on the entire surface of the resultant structure at a temperature of about 300-degree celsius.

Figure 4:
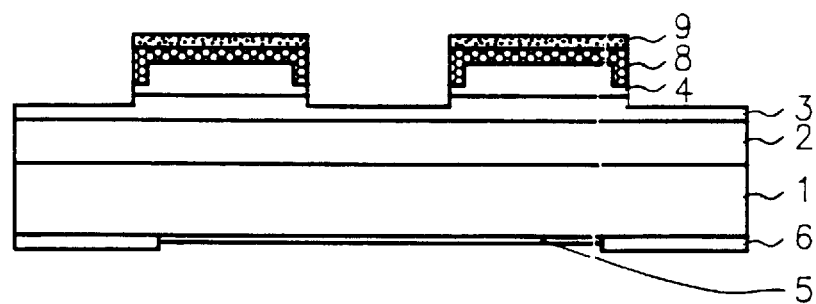

Then, as shown in FIG. 4, a photoresist pattern 9 of an area about 0.5–1 micrometer wider than that of the post is formed on the surface of the post and used as an etch barrier so as to result in a structure of FIG. 4 having the protection layer 8, the remaining top mirror layer 4 and some portion of the active layer 4 etched.

Figure 5:
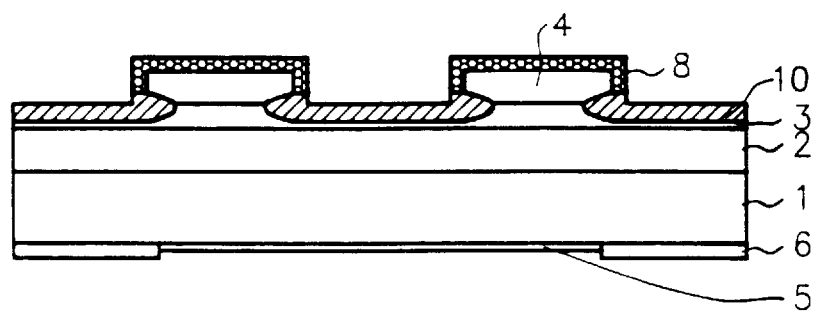

Next, as shown in FIG. 5, using an exposed top mirror layer 4 and some portions of the active layer 3 as a barrier against the hydrogenation, the structure is subjected to the hydrogenation processing at a temperature of around 250–400 degree celsius under a hydrogen pressure of about 1 Torr, for about 0.5 to 2 hours. At this time, due to the hydrogenation, some portions of the top mirror layer 4 and the active layer 3 exposed except for the protection layer 8 can be provided with an electrically hydrogenation area 10 having a depth of around 0.5–20 micrometers which vary with the set process temperature and time period.

Figure 6:
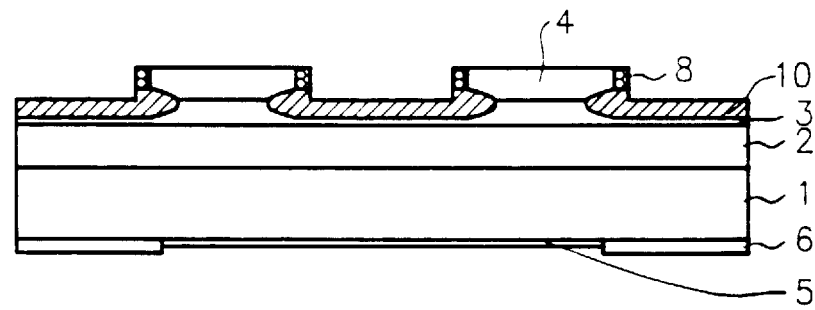

Next, as shown in FIG. 6, the protection layer on the post is removed to allow the subsequent contact to a p-type electrode, which leaves the top layer 4 exposed. The protection layer 8 is etched away by using a fluorine-based reactive ion etching.

Figure 7:
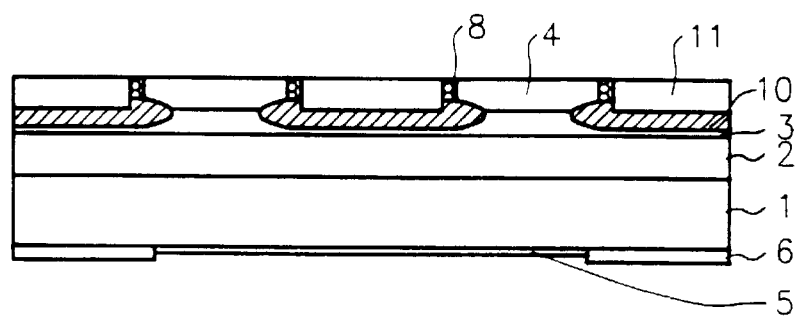

Next, as shown in FIG. 7, over the entire surface of the resultant structure is formed a polyimide film 11 for a planarization, and then the top mirror layer 4 on the post is again exposed.

Figure 8:
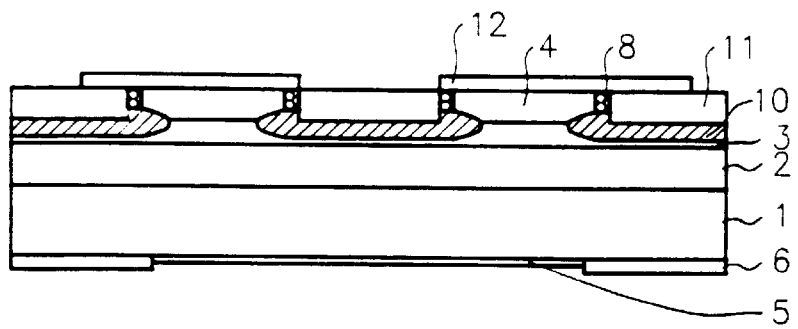

Finally, as shown in FIG. 8, the exposed top layer 4 is provided with a p-type electrode pad 12 which contacts thereto, resulting in completion of the vertical-cavity surface-emitting laser.

To obtain the vertical-cavity surface-emitting laser of low threshold current and single mode emitting characteristics, research has been intensively carried out. However, it is very difficult to provide fabrication method satisfying both such requirements.

Hydrogenation causes an electrical passivation of the semiconductor, but the refractive index thereof almost remains unchanged, resulting in the unchanged optical features. Accordingly, the employed hydrogenation electrically provides a smaller passivation area by 40 micrometer in diameter than that of the post which is formed by etching, and optically provides no optical damage at the top mirror layer formed by etching. In addition, the partial protection of the top mirror layer by the use of the hydrogenated barrier allows the current injection area of the top mirror to be wider than that of the active layer, so that the serial resistance can thus be reduced. Therefore, the hydrogenated surface-emitting device according to the present invention effectively accomplishes the current and optical confinements, whereby low threshold current and single mode emitting features can be obtained.

In conclusion, the hydrogenated surface-emitting laser according to the present invention accomplishes advantageous effect in that the size thereof can be effectively reduced from an electrical passivation through the hydrogenation processing of portions of cavity after forming the post by etching. Further, since the active layer is smaller as compared to the top mirror layer into which the current is injected, low threshold current characteristics can be obtained. The single mode emitting feature is feasible because the optical features of the top mirror layer remains unchanged regardless of the hydrogenation.

The present invention has the following effects. First, after forming the post by using ion beam etching technique, portions of the cavity are subjected to the hydrogenation with the protection film as a mask applied so as to result in an electrical passivation, so the device size can thus be effectively reduced.

Second, since smaller active layer as compared to the current injection area can be formed and damages at the surface which may occur when conducting etching during the hydrogenation are inactivated, the leakage current is reduced, thus allowing low threshold current characteristics.

Third, GaAs-based compounds providing a constant refractive index regardless of the hydrogenation is effectively employed in deriving the feature of the single mode emission.

While the present invention has been described with respect to certain preferred embodiment only, other modifications and variations may be made without departing from the scope of the present invention as set forth in the following claims.

What is claimed is:

1. A method for producing a vertical-cavity surface-emitting laser comprising the steps of:

sequentially forming a bottom mirror layer, an active layer and a top mirror layer on a compound semiconductor substrate;

forming an antireflection layer on a rear surface of the compound semiconductor substrate;

selectively etching predetermined peripheral portions of the antireflection layer, and then forming a first electrode;

forming a first photoresist pattern on a surface of the top mirror layer to define laser emission portions, and removing the first photoresist pattern after selectively etching portions of the top mirror layer by using the first photoresist pattern as a mask;

forming a protection layer for hydrogenation barrier over an entire surface of the resultant structure;

forming a second photoresist pattern on a surface of the protection layer for hydrogenation barrier of a post, and removing the second photoresist pattern after selectively etching the hydrogenated barrier, the top mirror layer and portions of the active layer by using the second photoresist pattern as a mask;

forming a passivation layer through the hydrogenating of the exposed top mirror layer and the portions of the active layer;

exposing the top mirror layer by etching the protection layer for hydrogenation barrier over the surface of the post;

forming a planarization layer over an entire surface of the resultant structure, and exposing the top mirror layer on the post; and forming a second electrode pad to which the exposed top mirror layer contacts.

2. The method as defined in claim 1, wherein the planarization film comprises a layer of polyimide.

3. The method as defined in claim 1, wherein the hydrogenated barrier comprises one of silicon-oxide layer or silicon-nitride layer.

4. The method as defined in claim 1, wherein the passivation layer has a thickness of around 0.5 to 20 micrometer.

5. The method as defined in claim 4, wherein the step of hydrogenating is performed at the atmosphere of hydrogen plasma having a pressure of about $10^{-4}$ Torr to 1 Torr.

6. The method as defined in claim 5, wherein the step of hydrogenating is performed at temperature of around 250 to 500 degree celsius.

7. The method as defined in claim 6, wherein the step of hydrogenating is performed for about 0.5 to 2 hours.

* * * * *

UNITED STATES PATENT AND TRADEMARK OFFICE
CERTIFICATE OF CORRECTION

PATENT NO. : 5,773,319

DATED : June 3o, 1998

INVENTOR(S) : Chu et al.

It is certified that error appears in the above-identified patent and that said Letters Patent is hereby corrected as shown below:

On the title page, under Foreign Application Priority Date, delete"[KP] DPR of Korea" and insert therefor:

--[KR] Rep. of Korea--

Signed and Sealed this

Eighth Day of December, 1998

Attest:

BRUCE LEHMAN

*Attesting Officer*  *Commissioner of Patents and Trademarks*